(12) United States Patent
Peng et al.

(10) Patent No.: US 11,626,553 B2
(45) Date of Patent: Apr. 11, 2023

(54) LIGHT-EMITTING APPARATUS AND MANUFACTURING METHOD THEREOF

(71) Applicant: Au Optronics Corporation, Hsinchu (TW)

(72) Inventors: Chung En Peng, Hsinchu (TW); Chung-Chan Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 17 days.

(21) Appl. No.: 17/322,845

(22) Filed: May 17, 2021

(65) Prior Publication Data

US 2022/0109090 A1 Apr. 7, 2022

(30) Foreign Application Priority Data

Oct. 6, 2020 (TW) .................................. 109134521

(51) Int. Cl.
*H01L 33/62* (2010.01)
*H01L 33/36* (2010.01)

(52) U.S. Cl.
CPC .............. *H01L 33/62* (2013.01); *H01L 33/36* (2013.01); *H01L 2933/0066* (2013.01)

(58) Field of Classification Search
CPC ....... H01L 33/62; H01L 33/36; H01L 33/486; H01L 25/0753; H01L 2933/0066; H01L 27/124; H01L 27/15; H01L 2224/11849; H01L 23/49811; H01L 23/49827; H01L 23/49816; H01L 24/799; H01L 24/98
See application file for complete search history.

(56) References Cited

U.S. PATENT DOCUMENTS

| 7,692,710 | B2 | 4/2010 | Shimamura et al. |
| 2007/0182843 | A1 | 8/2007 | Shimamura et al. |
| 2013/0075767 | A1 | 3/2013 | Yamaguchi et al. |
| 2019/0305199 | A1* | 10/2019 | Li ........................ H01L 25/0753 |
| 2020/0028044 | A1* | 1/2020 | Lee .......................... H01L 33/62 |
| 2020/0294975 | A1 | 9/2020 | Xuan et al. |
| 2021/0110748 | A1* | 4/2021 | Kim ......................... H01L 33/62 |

FOREIGN PATENT DOCUMENTS

| CN | 101013714 | 8/2007 |
| CN | 109003966 | 12/2018 |
| CN | 109920814 | 6/2019 |
| CN | 110197814 | 9/2019 |
| TW | 200709403 | 3/2007 |

* cited by examiner

*Primary Examiner* — Latanya N Crawford Eason
(74) *Attorney, Agent, or Firm* — JCIPRNET (57) ABSTRACT

A light-emitting apparatus including a circuit substrate and a light-emitting device is provided. The circuit substrate includes a first electrode and a second electrode. The light-emitting device is disposed on a first surface of the circuit substrate. The light-emitting device includes a first conductive terminal and a second conductive terminal. The first conductive terminal and the second conductive terminal are embedded between the first electrode and the second electrode. In a first direction, there is a first distance between an inner edge of the first electrode and an inner edge of the second electrode, there is a second distance between an outer edge of the first conductive terminal and an outer edge of the second conductive terminal, and the first distance is greater than or equal to the second distance.

17 Claims, 11 Drawing Sheets

LIGHT-EMITTING APPARATUS AND MANUFACTURING METHOD THEREOF

CROSS-REFERENCE TO RELATED APPLICATION

This application claims the priority benefit of Taiwan application serial no. 109134521, filed on Oct. 6, 2020. The entirety of the above-mentioned patent application is hereby incorporated by reference herein and made a part of this specification.

BACKGROUND OF THE INVENTION

Field of the Invention

The invention relates to an electronic apparatus and a manufacturing method thereof, and more particularly, to a light-emitting apparatus and a manufacturing method thereof.

Description of Related Art

In the manufacturing process of a light-emitting apparatus, unavoidable defects may occur. Therefore, how to perform a simpler repair for a defect, so that the repaired light-emitting apparatus still has considerable quality, has become an urgent issue to be solved at present.

SUMMARY OF THE INVENTION

The invention provides a light-emitting apparatus and a manufacturing method thereof that may provide the light-emitting apparatus with better quality.

A light-emitting apparatus of the invention includes a circuit substrate and a light-emitting device. The circuit substrate includes a first electrode and a second electrode. The light-emitting device is disposed on a first surface of the circuit substrate. The light-emitting device includes a first conductive terminal and a second conductive terminal. The first conductive terminal and the second conductive terminal are embedded between the first electrode and the second electrode. In a first direction, there is a first distance between an inner edge of the first electrode and an inner edge of the second electrode, there is a second distance between an outer edge of the first conductive terminal and an outer edge of the second conductive terminal, and the first distance is greater than or equal to the second distance.

A manufacturing method of a light-emitting apparatus of the invention includes the following steps: providing a circuit substrate having a plurality of electrode pairs, wherein each of the electrode pairs includes a first electrode and a second electrode; providing a light-emitting device including a first conductive terminal and a second conductive terminal; and disposing the light-emitting device on the circuit substrate so that the first conductive terminal and the second conductive terminal are embedded between the first electrode and the second electrode, wherein in a first direction, there is a first distance between an inner edge of the first electrode and an inner edge of the second electrode, there is a second distance between an outer edge of the first conductive terminal and an outer edge of the second conductive terminal, and the first distance is greater than or equal to the second distance.

Based on the above, via the corresponding arrangement between the first electrode and the second electrode of the circuit substrate and the first conductive terminal and the second conductive terminal of the light-emitting device, the repair of the light-emitting apparatus may be easier in the manufacturing process thereof, and possible damage to the devices may be reduced during the manufacturing process. In this way, the light-emitting apparatus may have better quality.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In order to make the aforementioned features and advantages of the disclosure more comprehensible, embodiments accompanied with figures are described in detail below. As those skilled in the art will notice, the embodiments provided may be modified in various different manners without departing from the spirit or scope of the invention.

In the figures, for clarity, the thicknesses of various devices are enlarged. In the entire specification, the same reference numerals represent the same devices. It should be understood that, when a layer, film, region, or a device of a substrate is "on another device" or "connected to another device", "overlapped with another device", the device may be directly on the other device or connected to the other device, or an intermediate device may also be present. On the other hand, when a device is "directly on another device" or "directly connected to" another device, an intermediate device is not present. As used in the present specification, "connected to" may refer to a physical and/or electrical connection.

It should be understood that, even though terms such as "first", "second", "third", etc., in the specification may be used herein to describe various components, members, regions, layers, and/or parts, these components, members, regions, and/or parts should not be limited by these terms. These terms are only used to distinguish one device, member, region, layer, or part from another device, member, region, layer, or part. Therefore, the "first device," "member," "region," "layer," or "portion" discussed below may be referred to as a second device, member, region, layer, or portion without departing from the teachings herein.

The terminology used here is only for the object of describing specific embodiments and is not limiting. As used herein, unless the content clearly indicates otherwise, the singular forms "a", "one", and "the" are intended to include the plural form, including "at least one". "Or" means "and/or". As used in the specification, the term "and/or" includes any and all combinations of one or a plurality of the associated listed items. It should also be understood that when used in the specification, the term "including" and/or "containing" specifies the stated features, regions, wholes, steps, operations, presence of devices, and/or members, but does not exclude the presence or addition of one or a plurality of other features, regions, wholes, steps, operations, devices, members, and/or a combination thereof.

In addition, relative terms such as "lower" or "bottom" and "upper" or "top" may be used herein to describe the relationship of one device to another device as shown in the figures. It should be understood that relative terms are intended to encompass different orientations of the apparatus in addition to the orientation shown. For example, if the apparatus in one figure is turned over, a device described as being on the "lower" side of another device is oriented to being on the "upper" side of the other device. Thus, the exemplary term "below" may include the orientations "below" and "above", depending on the particular orientation of the figures. Similarly, if the apparatus in one figure is turned over, a device described as "below" another device or a device "below" is oriented "above" the other device. Thus, the exemplary term "under" or "below" may encompass the orientations of above and below.

"Substantially" used in the specification includes the value and the average value within an acceptable deviation range of a specific value confirmed by those having ordinary skill in the art, and the concerned measurement and a specific quantity (i.e., limitations of the measuring system) of measurement-related errors are taken into consideration. For example, "substantially" may represent within one or a plurality of standard deviations of the value, or within ±30%, ±20%, ±10%, or ±5%.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

In the present specification, exemplary embodiments are described with reference to cross sections of schematics used as ideal embodiments. Therefore, changes in shape of figures used as the results of, for example, manufacturing techniques and/or tolerance may be expected. Therefore, the embodiments of the invention should not be construed to limit the specific shapes of the regions shown in the present specification, but instead include shape deviations caused by, for example, manufacture. For example, regions shown or described as flat generally may have rough and/or non-linear features. Moreover, an acute angle shown may be round. Therefore, the regions shown in the figures are essentially schematic, and the shapes thereof do not refer to the accurate shapes of the regions shown, and also do not limit the scope of the claims.

In addition, for clarity, some of the film layers or members may be omitted from the figures.

Figure 1A:
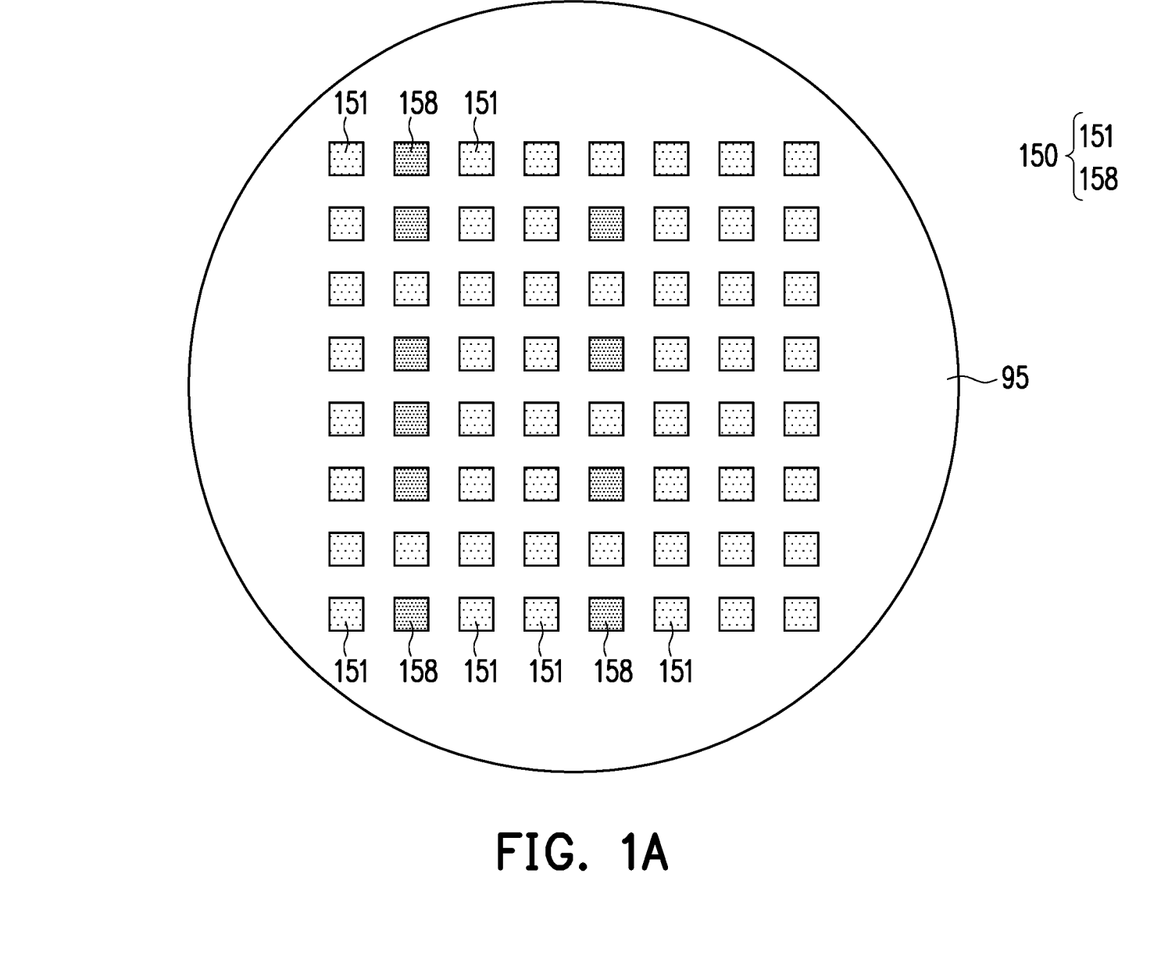
FIG. 1A is a schematic top view of a portion of a manufacturing method of a light-emitting apparatus according to the first embodiment of the invention.

Referring to FIG. 1A, light-emitting devices 150 are provided.

In the present embodiment, a plurality of light-emitting devices 150 may be disposed or formed on a carrier board 95. In the present embodiment, the carrier board 95 is, for example, a wafer, but the invention is not limited thereto. In the present embodiment, the plurality of light-emitting devices 150 may be disposed in an array form or formed on the carrier board 95, but the invention is not limited thereto. In an embodiment, there may be a temporary connecting structure (such as a tether, but not limited thereto) or a temporary connecting film layer (such as a release layer, but not limited thereto) between the plurality of light-emitting devices 150 and the carrier board 95, but the invention is not limited thereto.

In an embodiment, before the light-emitting devices 150 disposed or formed on the carrier board 95 are transferred, the light-emitting devices 150 disposed or formed on the carrier board 95 may be inspected first. For example, whether the plurality of light-emitting devices 150 disposed or formed on the carrier board 95 are damaged, scratched, chipped, short-circuited, defective in appearance, etc. may be confirmed via automated optical inspection (AOI). However, the invention does not limit the above inspection method.

In the present embodiment, the plurality of light-emitting devices 150 disposed or formed on the carrier board 95 may include good light-emitting devices 151 (may be referred to as: known good dies (KGDs)). In the present embodiment, the plurality of light-emitting devices 150 disposed or formed on the carrier board 95 may further include bad light-emitting devices 158 (may be called: electronic devices). In other words, the invention does not limit the plurality of light-emitting devices 150 disposed or formed on the carrier board 95 to all be in good condition.

Moreover, for clarity, in FIG. 1A, not every light-emitting device 150 (may include the good light-emitting devices 151 and the bad light-emitting devices 158) is labeled.

Figure 1B:
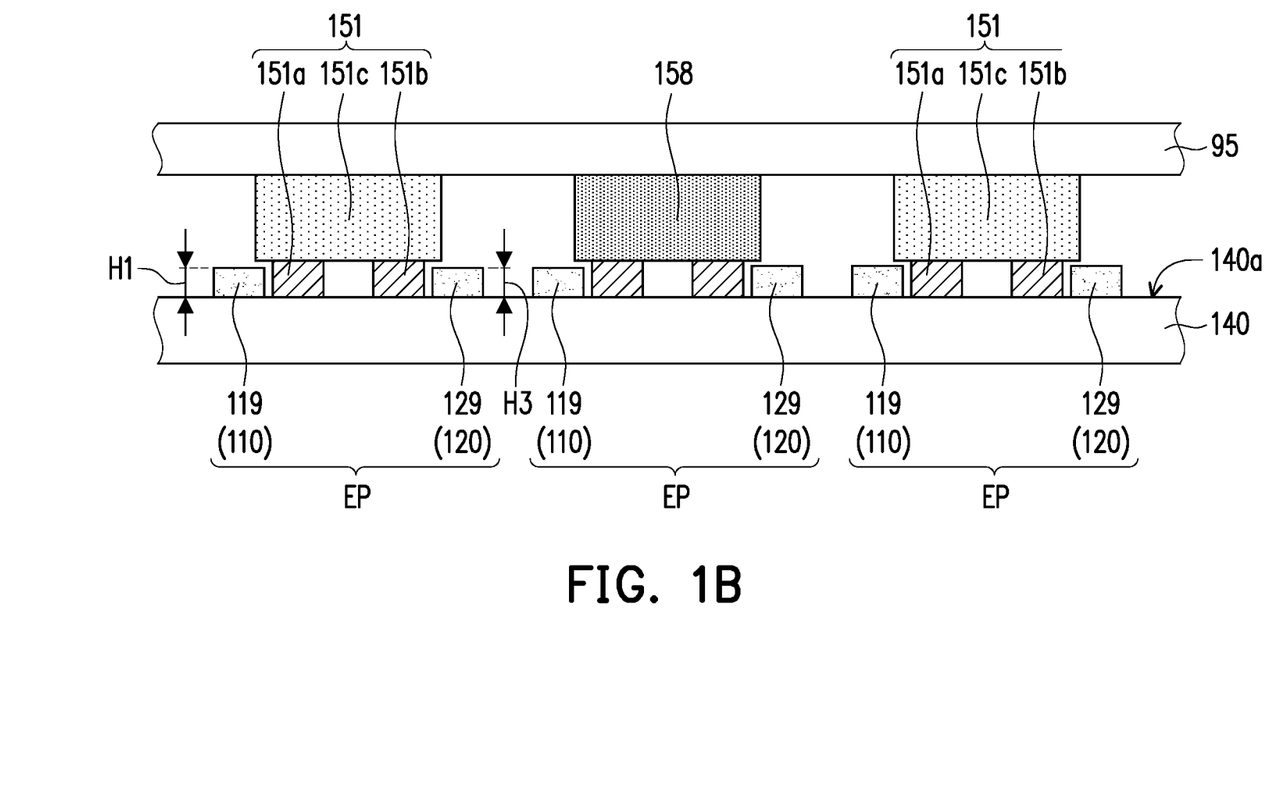
FIG. 1B to FIG. 1F are schematic partial cross-sectional views of a portion of a manufacturing method of a light-emitting apparatus according to the first embodiment of the invention.

Referring to FIG. 1B, a circuit substrate 140 is provided. There may be a plurality of electrode pairs EP on a first surface 140a of the circuit substrate 140. Each of the electrode pairs EP includes a corresponding first electrode 110 and a corresponding second electrode 120. The first electrode 110 may include a first upper electrode 119. The second electrode 120 may include a second upper electrode 129.

Referring further to FIG. 1B, the light-emitting devices 150 are disposed on the first surface 140a of the circuit substrate 140. Each of the light-emitting devices 150 may include a corresponding light-emitting die, a corresponding first conductive terminal, and/or a corresponding second conductive terminal. For example, the light-emitting device 151 may include a corresponding light-emitting die 151c, a corresponding first conductive terminal 151a, and a corresponding second conductive terminal 151b. The first conductive terminal (such as the first conductive terminal 151a) and the second conductive terminal (such as the second conductive terminal 151b) of the light-emitting device 150 are embedded between the first upper electrode 119 and the second upper electrode 129 of one of the electrode pairs EP of the circuit substrate 140.

In the present embodiment, the first conductive terminal (such as the first conductive terminal 151a) may not be in contact with the top end of the first upper electrode 119 (i.e., the place where the first upper electrode 119 is farthest away from the first surface 140a), and the second conductive terminal (such as the second conductive terminal 151b) may not be in contact with the top end of the second upper electrode 129 (i.e., the place where the second upper electrode 129 is farthest from the first surface 140a).

In the step of FIG. 1B, the first conductive terminal (e.g., the first conductive terminal 151a) may not be in contact with the entire first upper electrode 119, but the invention is not limited thereto. In a possible embodiment, the first conductive terminal (e.g., the first conductive terminal 151a) may not be electrically connected to the first upper electrode 119.

In the step of FIG. 1B, the second conductive terminal (e.g., the second conductive terminal 151b) may not be in contact with the entire second upper electrode 129, but the invention is not limited thereto. In a possible embodiment, the second conductive terminal (e.g., the second conductive terminal 151b) may not be electrically connected to the second upper electrode 129.

In the present embodiment, the plurality of light-emitting devices 150 located on the carrier board 95 may be disposed on the circuit substrate 140. In other words, in the step of FIG. 1B, the light-emitting devices 150 disposed on the circuit substrate 140 may include good light-emitting devices 151; or, may further include a bad light-emitting device 158 (may be called an electronic device).

Figure 1C:
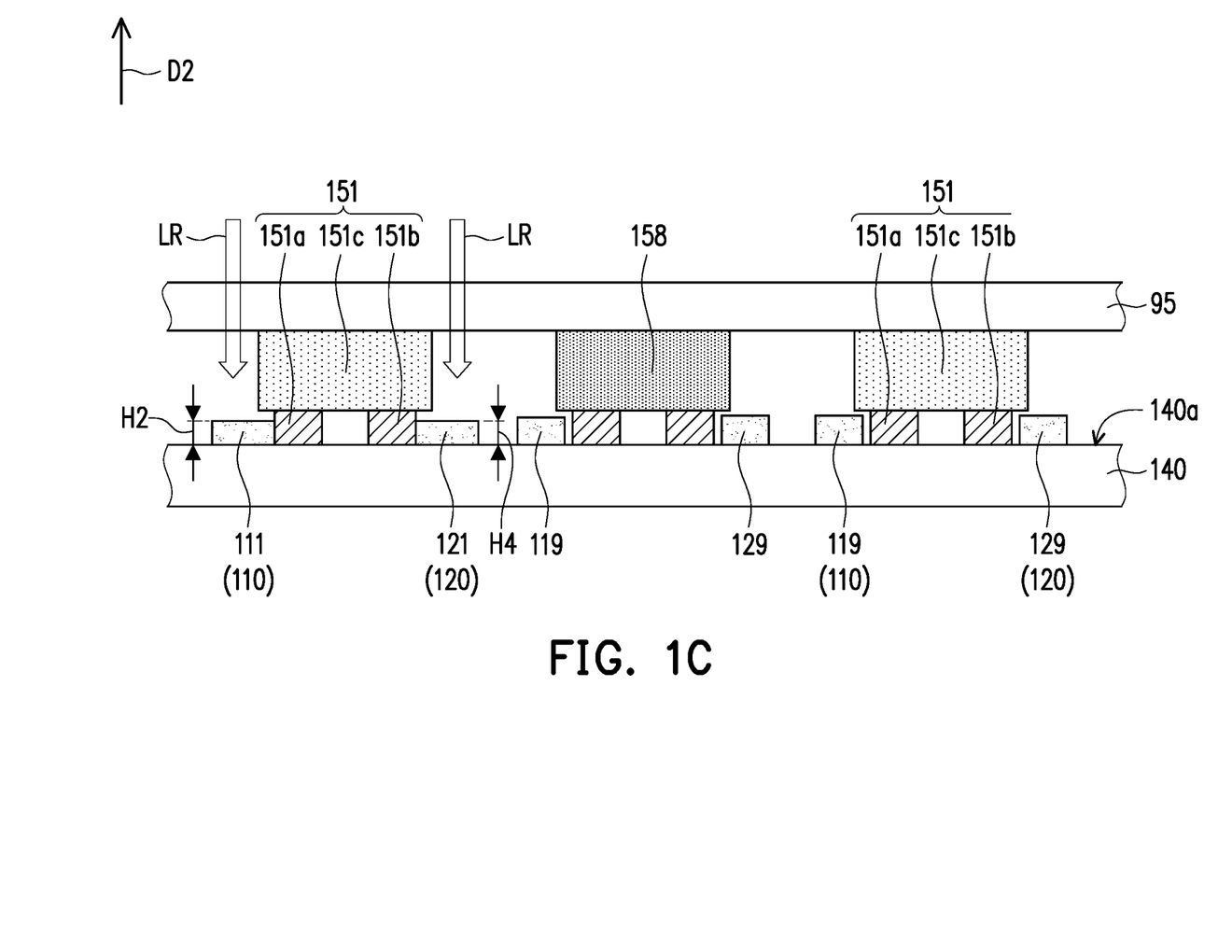

Referring to FIG. 1B to FIG. 1C, at least a portion of the first upper electrode is heated, and the heated first upper electrode may be electrically connected to the corresponding first conductive terminal; and at least a portion of the second upper electrode is heated, and the heated second upper electrode may be electrically connected to the corresponding second conductive terminal.

For clarity or explanation, in FIG. 1B, FIG. 1C, and similar subsequent figures, the first upper electrode and the second upper electrode not heated and/or not connected to the corresponding conductive terminals may be marked with reference numerals 119 and 129, respectively. In FIG. 1C and subsequent similar figures, the first upper electrode and the second upper electrode already heated or being heated and connected to the corresponding conductive terminals may be marked with reference numerals 111 and 121 respectively.

In the present embodiment, as shown in FIG. 1B to FIG. 1C, the first upper electrode 111 and/or the second upper electrode 121 corresponding to the good light-emitting device 151 may be heated.

In the present embodiment, at least a portion of the first upper electrode of 111 may be melted by heating. In this way, the first upper electrode 111 may be directly in contact with and/or connected to the corresponding first conductive terminal 151a.

In the present embodiment, the melting point of the first upper electrode 111 is less than the melting point of the first conductive terminal 151a. In an embodiment, when the first upper electrode 111 is heated and melted, the first conductive terminal 151a may still be solid. In an embodiment, when the first upper electrode 111 is heated and melted, the remaining portion of the first electrode 110 (i.e., the portion of the first electrode 110 not belonging to the first upper electrode 111) may still be solid.

In an embodiment, the melting point of the first upper electrode 111 may be less than 500° C. In an embodiment, the melting point of the first upper electrode 111 may further be less than 250° C. In an embodiment, the material of the first upper electrode 111 may include bismuth (Bi), tin (Sn), lead (Pb), indium (In), cadmium (Cd), gallium (Ga), other suitable metals with relatively low melting points, or a combination or an alloy of the above; and the material of the first conductive terminal 151a may include gold, copper, other suitable metals with relatively high melting points, or a combination or an alloy of the above. In a possible embodiment, the portion where the first upper electrode 111 and the first conductive terminal 151a are in contact with each other or the material thereof may form a corresponding intermetallic compound (IMC), and the IMC may still be considered that the first upper electrode 111 and the first conductive terminal 151a are in contact with each other.

In the present embodiment, at least a portion of the second upper electrode 121 may be melted by heating. In this way, the second upper electrode 121 may be directly in contact with and/or connected to the corresponding second conductive terminal 151b.

In the present embodiment, the melting point of the second upper electrode 121 is less than the melting point of the second conductive terminal 151b. In an embodiment, when the second upper electrode 121 is heated and melted, the second conductive terminal 151b may still be solid. In an embodiment, when the second upper electrode 121 is heated and melted, the remaining portion of the second electrode 120 (i.e., the portion of the second electrode 120 not belonging to the second upper electrode 121) may still be solid.

In an embodiment, the material of the second upper electrode 121 may be the same as or similar to that of the first upper electrode 111; and the material of the second conductive terminal 151b may be the same as or similar to that of the first conductive terminal 151a. In other words, the melting point of the second upper electrode 121 may be less than 500° C.; or, it may be further less than 250° C. In a possible embodiment, the portion where the second upper electrode 121 and the second conductive terminal 151b are in contact with each other or the material thereof may form a corresponding IMC.

In the present embodiment, the first upper electrode 111 and/or the second upper electrode 121 may be heated by laser heating. In an embodiment, by irradiating a laser LR to heat the first upper electrode 111 and/or the second upper electrode 121, damage to other devices (such as the light-emitting devices 150 or other devices in the circuit substrate 140) may possibly be reduced during the heating process. In an embodiment, the laser LR suitable for heating may include an infrared laser.

In the present embodiment, in a second direction D2 perpendicular to the first surface 140a, a portion of the first upper electrode 111 and/or a portion of the second upper electrode 121 is not overlapped with the light-emitting die (e.g., the light-emitting die 151c). Therefore, if the first upper electrode 111 and/or the second upper electrode 121 are/is to be heated by the laser LR, the light irradiation direction of the laser LR may be adjusted to a direction substantially vertical and facing the first surface 140a. Next, the area where the first upper electrode 111 and/or the second upper electrode 121 is not overlapped with the light-emitting die (such as the light-emitting die 151c) is irradiated. In this way, damage to other devices (such as the light-emitting devices 150 or other devices in the circuit substrate 140) may be reduced during the process of heating the first upper electrode 111 and/or the second upper electrode 121 by laser. In addition, via the above laser light irradiation method, the number of the light-emitting devices 150 disposed in a unit area may also be increased.

In the present embodiment, the first upper electrode 111 and the second upper electrode 121 may be respectively electrically connected to the first conductive terminal 151a and the second conductive terminal 151b of the light-emitting devices 150 in a similar manner as described above.

In the present embodiment, the first conductive terminal 151a may not be in contact with the top end of the first upper electrode 111 (i.e., the place where the first upper electrode 111 is farthest away from the first surface 140a), and the second conductive terminal 151b may not be in contact with the top end of the second upper electrode 121 (i.e., the place where the second upper electrode 121 is farthest from the first surface 140a).

Compared with before the first upper electrode 119 and/or the second upper electrode 129 are/is heated, the thickness (es) of the first upper electrode 111 and/or the second upper electrode 121 after heating may be less. For example, before the first upper electrode 119 is heated, there is a first height H1 between the top end of the first upper electrode 119 and the first surface 140a; after the first upper electrode 111 is heated, there is a second height H2 between the top end of the first upper electrode 111 and the first surface 140a; and the first height H1 may be greater than the second height H2. For example, before the second upper electrode 129 is heated, there is a third height H3 between the top end of the second upper electrode 129 and the first surface 140a; after the second upper electrode 121 is heated, there is a fourth height H4 between the top end of the second upper electrode 121 and the first surface 140a; and the third height H3 may be greater than the fourth height H4.

In FIG. 1C, at least a portion of the good light-emitting devices 151 may emit light by the corresponding driving current or voltage. That is to say, in an embodiment, the structure in FIG. 1C may already be referred to as a light-emitting apparatus.

In the present embodiment, when the light-emitting devices 150 are disposed on the circuit substrate 140, the first surface 140a of the circuit substrate 140 may not have an insulating adhesive material (because there is none, an insulating adhesive material is not shown or marked). The above insulating adhesive material may include tape or glue, but the invention is not limited thereto. The glue includes a polyacrylic resin or a derivative thereof, an epoxy resin or a derivative thereof, a polyurethane resin or a derivative thereof, a phenol resin or a derivative thereof, an acrylate resin or a derivative thereof, a silane resin or a derivative thereof, other similar insulating resins, or a combination of the above, but the invention is not limited thereto.

Figure 1D:
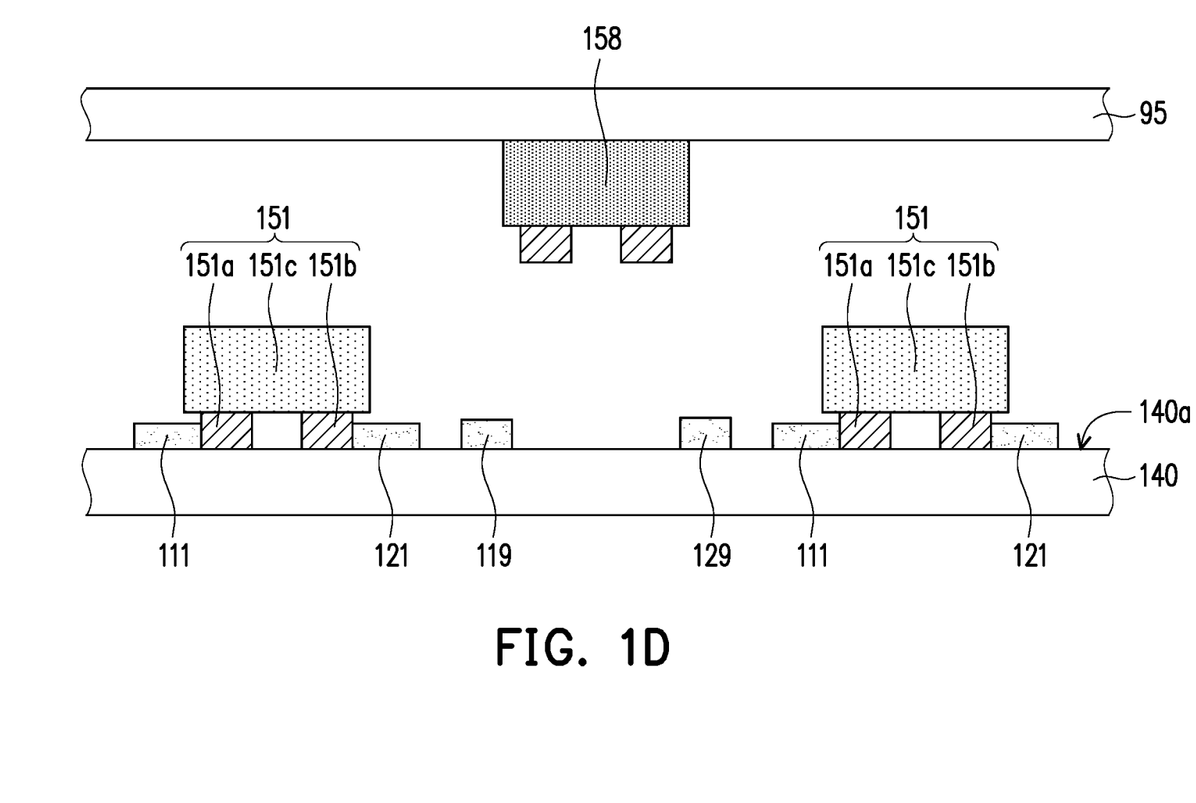

Referring to FIG. 1C to FIG. 1D, in the present embodiment, the defective light-emitting device 158 (which may be called an electronic device) disposed on the circuit substrate 140 may be removed. For example, the carrier board 95 may be picked up to remove the defective light-emitting device 158 from the circuit substrate 140, but the invention is not limited thereto.

In the present embodiment, the first upper electrode 119 and/or the second upper electrode 129 are/is not in contact with or firmly connected to the light-emitting device 158. In this way, the defective light-emitting device 158 may be readily removed from the circuit substrate 140.

In the present embodiment, via the above method of disposing/removing the light-emitting device 158, damage to the first electrode 110 and/or the second electrode 120 may be substantially reduced. In an embodiment, during the process of disposing/removing the light-emitting device 158, the first electrode 110 and/or the second electrode 120 may not even be touched.

Figure 1E:
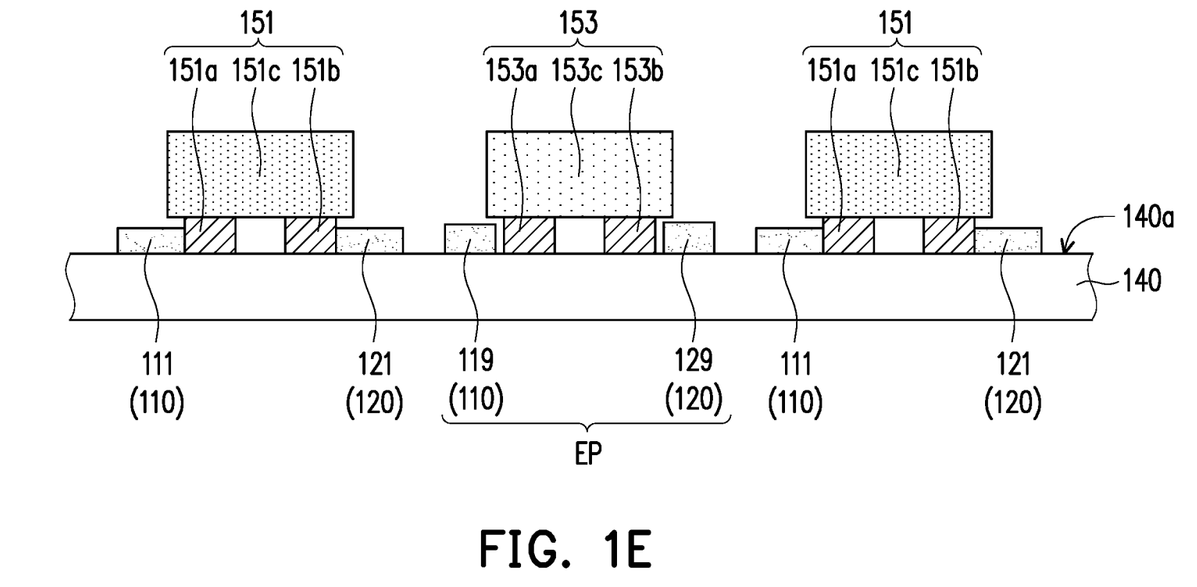

Referring to FIG. 1D to FIG. 1E, in the present embodiment, after the defective light-emitting element 158 disposed on the circuit substrate 140 is removed, a light-emitting device 153 may be disposed on the circuit substrate 140. The light-emitting device 153 may be the same as or similar to the light-emitting devices 151. That is, the light-emitting device 153 may include a light-emitting die 153c, a first conductive terminal 153a, and a second conductive terminal 153b. The first conductive terminal 153a and the second conductive terminal 153b of the light-emitting device 153 are embedded between the first upper electrode 119 and the second upper electrode 129 of one of the electrode pairs EP of the circuit substrate 140.

In an embodiment, the light-emitting device 153 may be disposed on the first surface 140a of the circuit substrate 140 by the same or similar disposing method of the light-emitting devices 151, but the invention is not limited thereto. In an embodiment, the light-emitting device 153 may be disposed on the circuit substrate 140 by a pick-and-place mechanism.

Figure 1F:
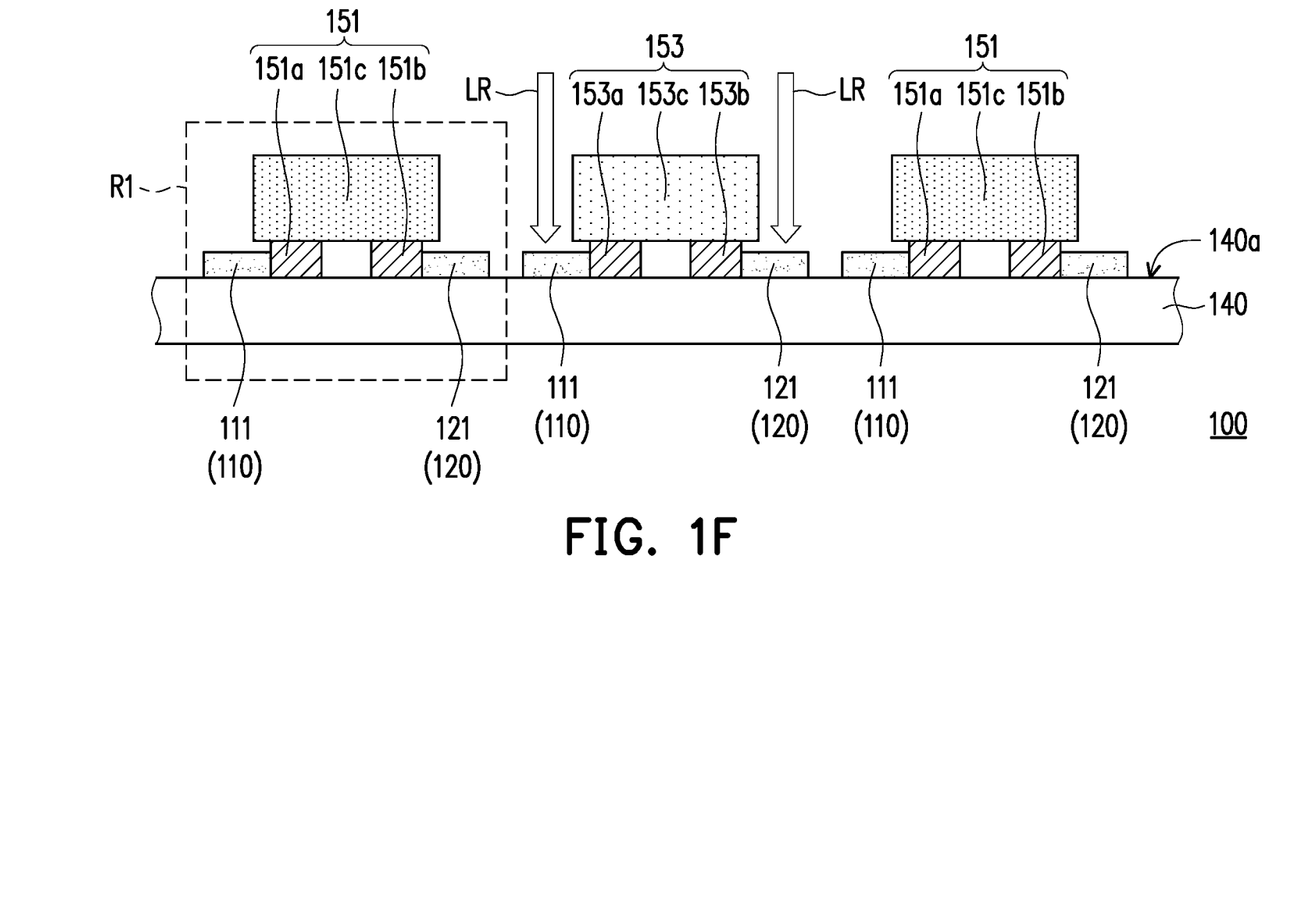

Referring to FIG. 1E to FIG. 1F, the first conductive terminal 153a and the second conductive terminal 153b of the light-emitting device 153 are electrically connected to the corresponding first upper electrode 111 and second upper electrode 121, respectively. For example, at least a portion of the first upper electrode 111 and/or the second upper electrode 121 may be melted by the same or similar heating method as above, so that the first upper electrode 111 and/or the second upper electrode 121 may be directly in contact with and/or connected to the corresponding first conductive terminal 153a and/or second conductive terminal 153b.

After the above manufacturing process, the manufacture of a light-emitting apparatus 100 of the present embodiment may be roughly completed.

Figure 1G:
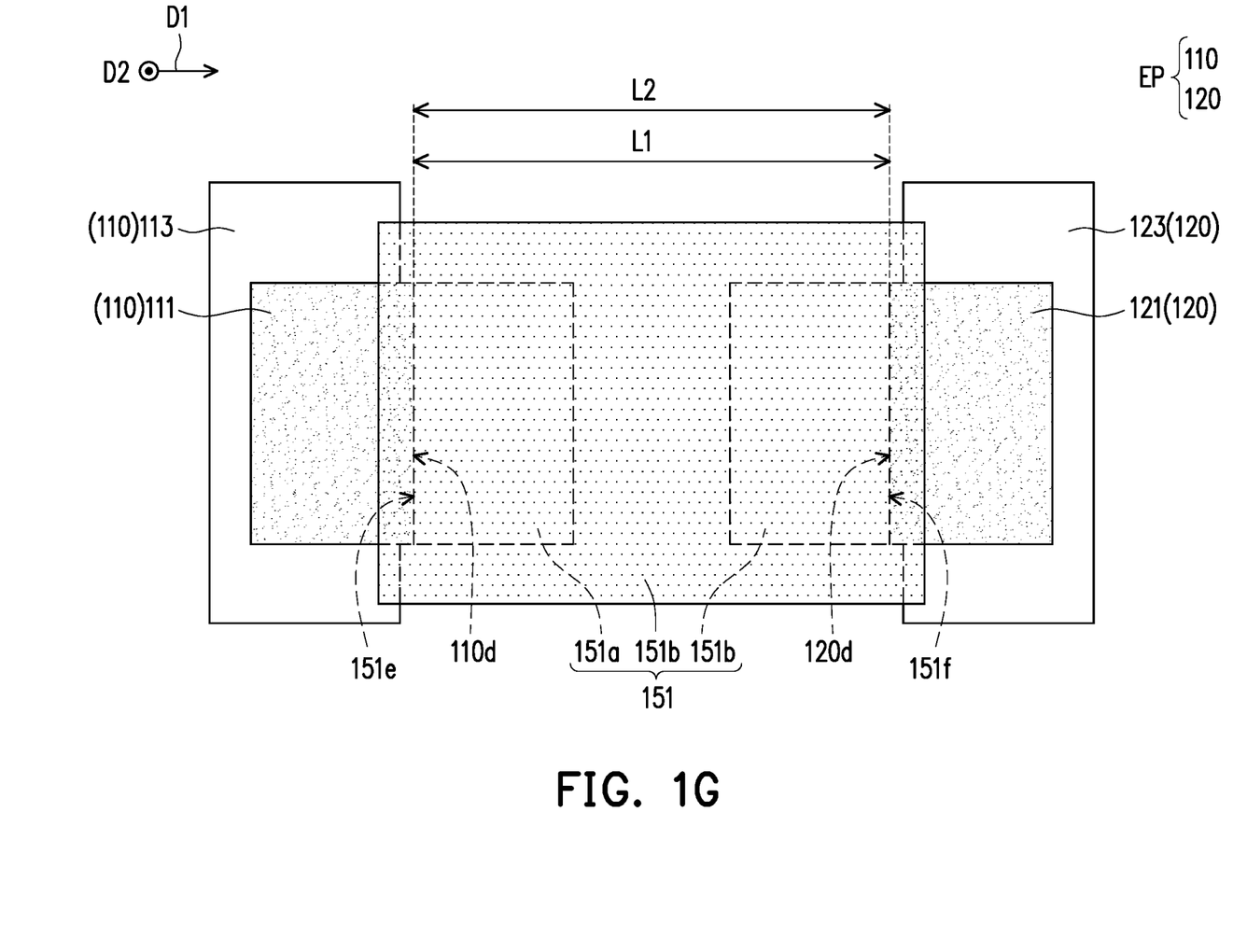
FIG. 1G is a schematic partial top view of a light-emitting apparatus according to the first embodiment of the invention.
Figure 1H:
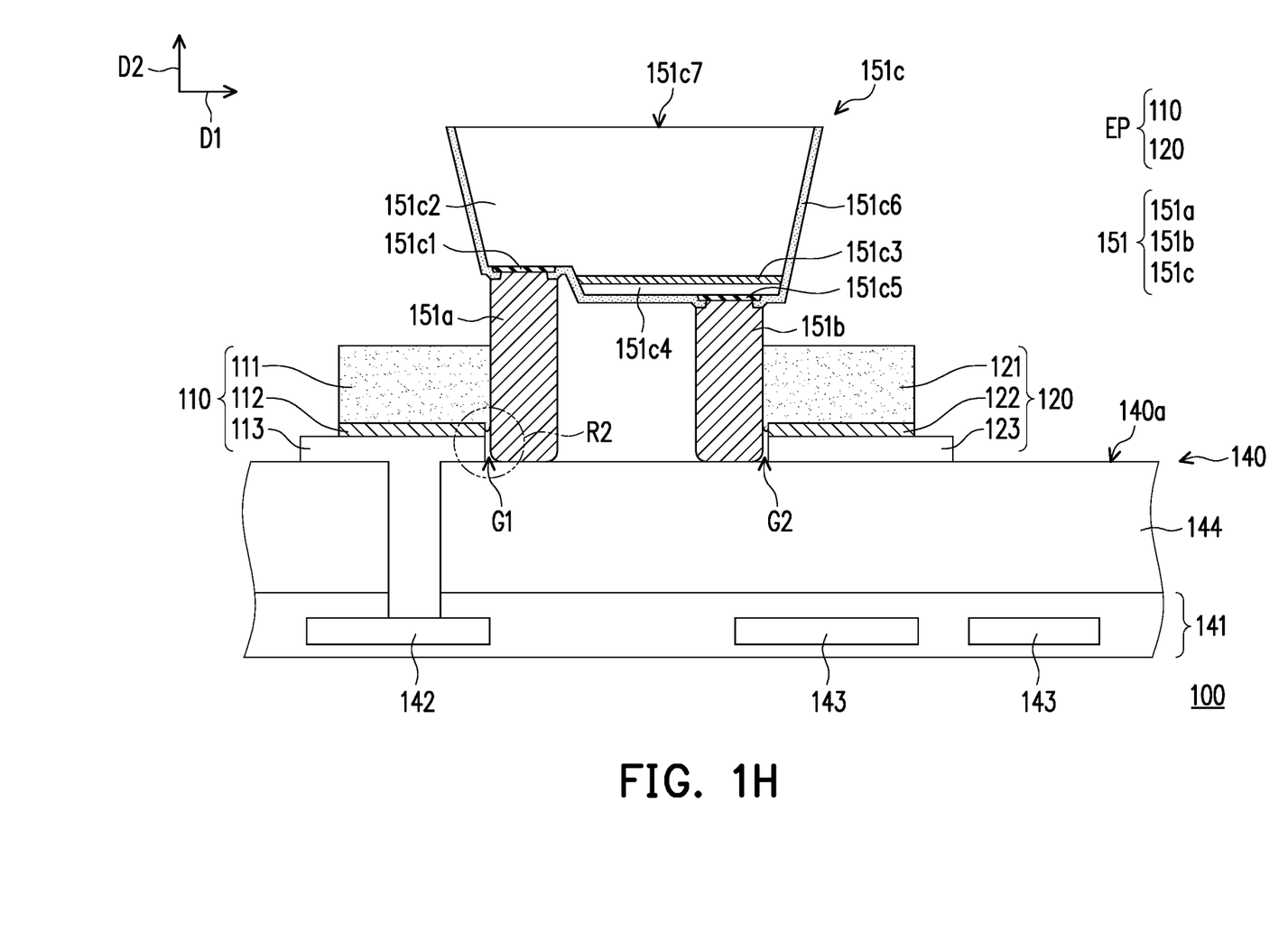
FIG. 1H and FIG. 1I are schematic partial cross-sectional views of a light-emitting apparatus according to the first embodiment of the invention.
Figure 1I:
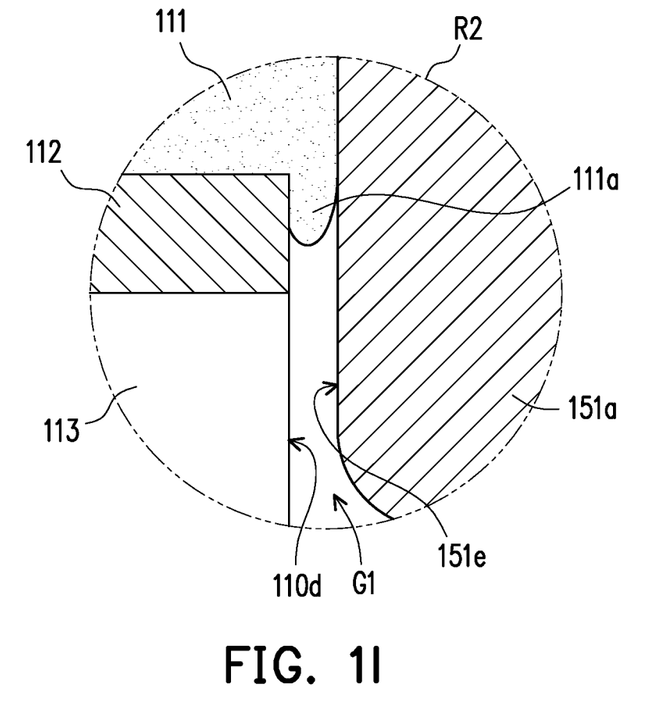

FIG. 1F may be a schematic partial cross-sectional view of a light-emitting apparatus according to the first embodiment of the invention. FIG. 1G is a schematic partial top view of a light-emitting apparatus according to the first embodiment of the invention. FIG. 1H and FIG. 1I are schematic partial cross-sectional views of a light-emitting apparatus according to the first embodiment of the invention. For example, FIG. 1G may be a schematic top view corresponding to a region R1 in FIG. 1F, FIG. 1H may be an enlarged view corresponding to the region R1 in FIG. 1F, and FIG. 1I may be an enlarged view corresponding to a region R2 in FIG. 1H.

Referring to FIG. 1G to FIG. 1I, taking the region R1 corresponding to the light-emitting device 151 as an example, the light-emitting apparatus 100 includes the circuit substrate 140 and the light-emitting device 151. The circuit substrate 140 includes the first electrode 110 and the second electrode 120. The light-emitting device 151 includes the first conductive terminal 151a and the second conductive terminal 151b. The first conductive terminal 151a and the second conductive terminal 151b are embedded between the first electrode 110 and the second electrode 120. In a first direction D1, there is a first distance L1 between an inner edge 110d of the first electrode 110 and an inner edge 120d of the second electrode 120, there is a second distance L2 between an outer edge 151e of the first conductive terminal 151a and an outer edge 151f of the second conductive terminal 151b, and the first distance L1 is greater than or equal to the second distance L2.

In an embodiment, the first direction D1 may be the direction having the shortest distance between the first upper electrode 111 and the second upper electrode 121 in the electrode pair EP to which the first upper electrode 111 and the second upper electrode 121 belong in the cross section (for example, the cross section shown in FIG. 1H) in which the first conductive terminal 151a and the second conductive terminal 151b are embedded between the first upper electrode 111 and the second upper electrode 121.

In an embodiment, the first direction D1 may be the direction having the longest distance between the edge of the first conductive terminal 151a and the edge of the second conductive terminal 151b in the light-emitting device 151 to which the first conductive terminal 151a and the second conductive terminal 151b belong in the cross section (for example, the cross section shown in FIG. 1H) in which the first conductive terminal 151a and the second conductive terminal 151b are embedded between the first upper electrode 111 and the second upper electrode 121.

In the present embodiment, the ratio of the first distance L1 to the second distance L2 may be between 1.0 and 1.1 (i.e., L1/L2=1.0 to 1.1).

In the present embodiment, the circuit substrate 140 may further include a device layer 141. The device layer 141 may include an active device 142 or other possible electronic devices 143. The electronic devices 143 may include other active devices, passive devices, or wires. At least one of the first electrode 110 and the second electrode 120 may be electrically connected to the active device 142. The device layer 141 may include corresponding conductive layers, dielectric layers, and/or semiconductor layers according to design requirements.

In the present embodiment, the circuit substrate 140 may further include an insulating layer 144. The insulating layer 144 may cover the device layer 141. The insulating layer 144 may be a single film layer or a stack of a plurality of film layers. In an embodiment, at least a portion of the insulating layer 144 may be referred to as a flat layer. In an embodiment, at least a portion of the insulating layer 144 may be referred to as a buffer layer. In an embodiment, at least a portion of the insulating layer 144 may be referred to as a protective layer. In an embodiment, at least a portion of the insulating layer 144 may be referred to as a solder mask. In an embodiment, the first surface 140a of the circuit substrate 140 may refer to the outer surface of the outermost insulating layer 144 (or; further including a virtual surface extending therefrom).

In the present embodiment, the outermost insulating layer 144 of the circuit substrate 140 may not be an adhesive material (because there is none, an adhesive material is not shown or marked). In other words, the first surface 140a of the circuit substrate 140 may not have an adhesive material.

In the present embodiment, one of the first electrode 110 and the second electrode 120 may be referred to as an anode, and the other of the first electrode 110 and the second electrode 120 may be referred to as a cathode. In the application of an embodiment, the anode and the cathode may be electrically separated from each other.

In the present embodiment, the first electrode 110 may include the first upper electrode 111, a first conductive connection layer 112, and a first lower electrode 113. The first conductive connection layer 112 may be sandwiched between the first upper electrode 111 and the first lower electrode 113. The first lower electrode 113 may penetrate the insulating layer 144 to be electrically connected to a device in the device layer 141 (for example, the active device 142).

In the present embodiment, the heat transfer coefficient of at least one of the film layers between the first upper electrode 111 and the device layer 141 may be less than the heat transfer coefficient of the first upper electrode 111. For example, the heat transfer coefficient of the first lower electrode 113 and/or the insulating layer 141 may be less than the heat transfer coefficient of the first upper electrode 111. In this way, in the process of manufacturing the light-emitting apparatus 100 (e.g., the step of heating the first upper electrode 111), thermal damage to other devices (e.g., the active device 142 in the device layer 141) may be reduced.

In an embodiment, the material of the first lower electrode 113 may include metal oxide, but the invention is not limited thereto. For example, the material of the first lower electrode 113 may include indium tin oxide, indium zinc oxide, aluminum tin oxide, aluminum zinc oxide, other suitable oxides, or a stack of at least two of the above, but the invention is not limited thereto.

In the present embodiment, the melting point of the first conductive connection layer 112 is greater than the melting point of the first upper electrode 111. In an embodiment, the material of the first conductive connection layer 112 may include metal. For example, the material of the first conductive connection layer 112 may be tantalum (Ta), titanium (Ti), other suitable metals with a relatively high melting point, or a combination or an alloy of the above. In a possible embodiment, the bonding force of the molten metal after cooling on the surface of another metal may be greater than the bonding force of the molten metal after cooling on the surface of another metal oxide.

In an embodiment, in the process of manufacturing the light-emitting apparatus 100 (for example, the step of heating the first upper electrode 111), via the first conductive connection layer 112, the quality of the electrical connection between the first upper electrode 111 and other conductive devices (such as the first lower electrode 113) may be improved. In addition, via the first lower electrode 113, thermal damage to other devices (such as an active device in the device layer) may be reduced. In this way, the quality or yield of the light-emitting apparatus 100 may be improved.

In the present embodiment, there is a first spacing G1 between the outer edge 151e of the first conductive terminal 151a and the inner edge 110d of the first electrode 110. In other words, the inner edge 110d of the first electrode 110 is not defined (but is still possible) to be the inner edge of the corresponding first upper electrode 111. A portion of the first upper electrode 111a may be filled in the first spacing G1, but the invention is not limited thereto. In an embodiment, the first conductive connection layer 112 and/or the first lower electrode 113 of the first electrode 110 may not be in direct contact with the first conductive terminal 151a. In an embodiment, a portion of the first upper electrode 111 may be located between the first conductive connection layer 112 and the first conductive terminal 151a.

In the present embodiment, in the second direction D2 perpendicular to the first surface 140a, the projected area of the first lower electrode 113 on the first surface 140a may be larger than the projected area of the first upper electrode 111 on the first surface 140a.

In the present embodiment, the second electrode 120 may include the second upper electrode 121, a second conductive connection layer 122, and a second lower electrode 123. The second conductive connection layer 122 may be sandwiched between the second upper electrode 121 and the second lower electrode 123. In an embodiment, the second upper electrode 121 may be electrically connected to a common power source via the second conductive connection layer 122 and the second lower electrode 123, but the invention is not limited thereto.

In the present embodiment, the second upper electrode 121, the second conductive connection layer 122, and/or the second lower electrode 123 may respectively have the same or similar materials and/or functions as the first upper electrode 111, the first conductive connection layer 112, and/or the first lower electrode 113, which are therefore not repeated herein.

In the present embodiment, there is a second spacing G2 between the outer edge 151*f* of the second conductive terminal 151*b* and the inner edge 120*d* of the second electrode 120. In other words, the inner edge 120*d* of the second electrode 120 is not defined (but is still possible) to be the inner edge of the corresponding second upper electrode 121. A portion of the second upper electrode 121 may be filled in the second spacing G2, but the invention is not limited thereto. In an embodiment, the second conductive connection layer 122 and/or the second lower electrode 123 of the second electrode 120 may not be in direct contact with the second conductive terminal 151*b*. In an embodiment, a portion of the second upper electrode 121 may be located between the second conductive connection layer 122 and the second conductive terminal 151*b*.

In the present embodiment, in the second direction D2 perpendicular to the first surface 140*a*, the projected area of the second lower electrode 123 on the first surface 140*a* may be larger than the projected area of the second upper electrode 121 on the first surface 140*a*.

In the present embodiment, the light-emitting device 151 may further include the light-emitting die 151*c*. The light-emitting die 151*c* may include a first conductive layer 151*c*1, a first semiconductor layer 151*c*2, a light-emitting layer 151*c*3, a second semiconductor layer 151*c*4, a second conductive layer 151*c*5, and a patterned insulating layer 151*c*6. The patterned insulating layer 151*c*6 may cover the first conductive layer 151*c*1, the first semiconductor layer 151*c*2, the light-emitting layer 151*c*3, the second semiconductor layer 151*c*4, and/or the second conductive layer 151*c*5. The patterned insulating layer 151*c*6 may have an opening exposing the first conductive layer 151*c*1, so that the first conductive terminal 151*a* may be electrically connected to the first semiconductor layer 151*c*2 via the first conductive layer 151*c*1. The patterned insulating layer 151*c*6 may have an opening exposing the second conductive layer 151*c*5, so that the second conductive terminal 151*b* may be electrically connected to the second semiconductor layer 151*c*4 via the second conductive layer 151*c*5. A light-emitting surface 151*c*7 of the light-emitting die 151*c* may face away from the circuit substrate 140.

Figure 2:
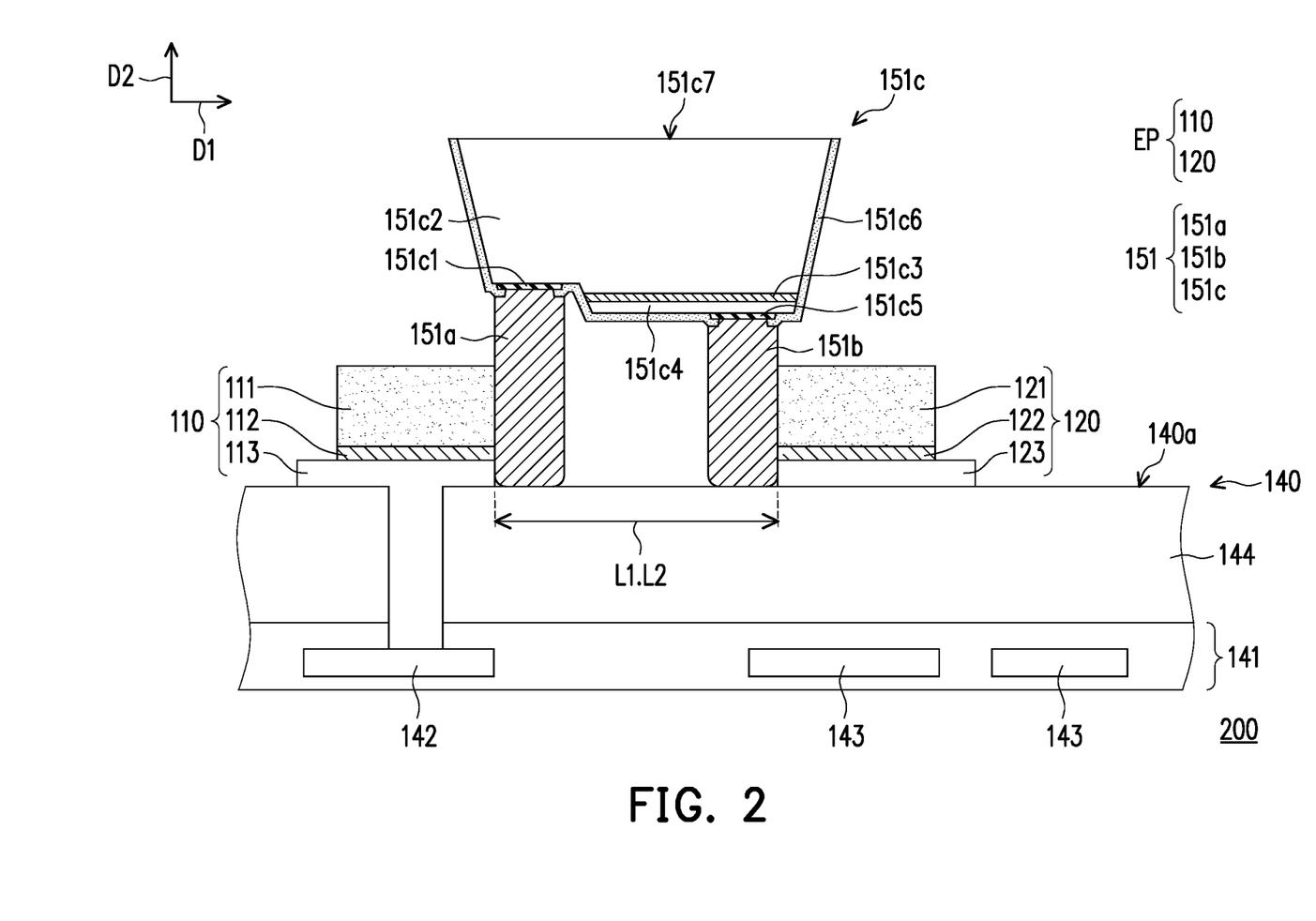
FIG. 2 is a schematic partial cross-sectional view of a light-emitting apparatus according to the second embodiment of the invention.

FIG. 2 is a schematic partial cross-sectional view of a light-emitting apparatus according to the second embodiment of the invention. The manufacturing method of a light-emitting apparatus 200 of the present embodiment is similar to the manufacturing method of the light-emitting apparatus 100, and similar members thereof are represented by the same reference numerals and have similar functions, materials, or forming methods, and are not repeated herein.

Referring to FIG. 2, in the present embodiment, the light-emitting apparatus 200 includes the circuit substrate 140 and the light-emitting device 151. In the first direction D1, there is the first distance L1 between the inner edge 110*d* of the first electrode 110 and the inner edge 120*d* of the second electrode 120, there is the second distance L2 between the outer edge 151*e* of the first conductive terminal 151*a* and the outer edge 151*f* of the second conductive terminal 151*b*, and the first distance L1 is substantially equal to the second distance L2.

In the present embodiment, the first upper electrode 111, the first conductive connection layer 112, and/or the first lower electrode 113 of the first electrode 110 may be in direct contact with the first conductive terminal 151*a*.

In the present embodiment, the second upper electrode 121, the second conductive connection layer 122, and/or the second lower electrode 123 of the second electrode 120 may be in direct contact with the second conductive terminal 151*b*.

Figure 3:
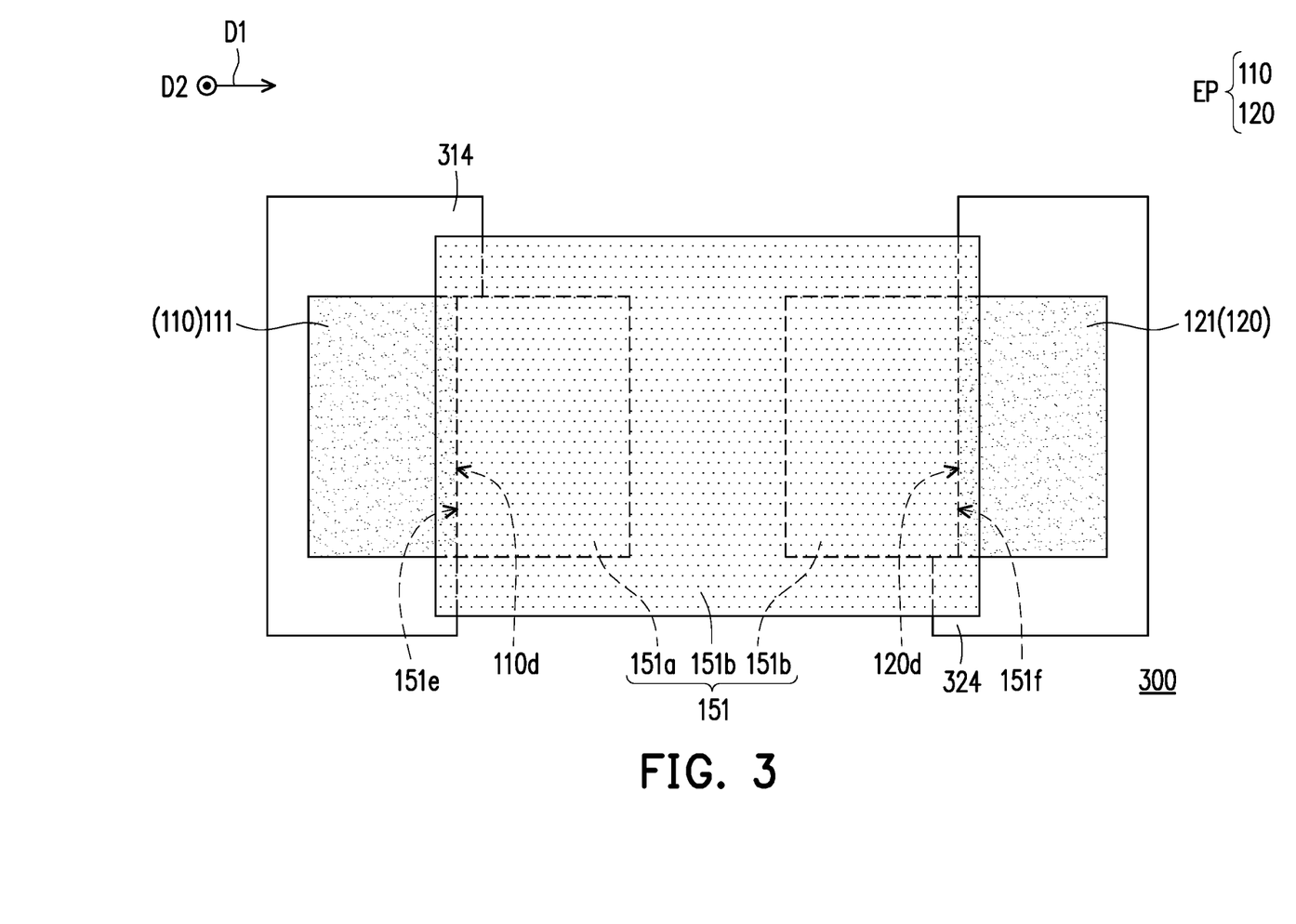
FIG. 3 is a schematic partial top view of a light-emitting apparatus according to the third embodiment of the invention.

FIG. 3 is a schematic partial cross-sectional view of a light-emitting apparatus according to the third embodiment of the invention. The manufacturing method of a light-emitting apparatus 300 of the present embodiment is similar to the manufacturing method of the light-emitting apparatus 100, and similar members thereof are represented by the same reference numerals and have similar functions, materials, or forming methods, and are not repeated herein.

In the present embodiment, the first lower electrode 113 of the first electrode 110 may further include a first electrode extension region 314. During the process of manufacturing the light-emitting apparatus 300 (e.g., the step of disposing the light-emitting devices 150 on the circuit substrate 140), the first electrode extension region 314 may possibly reduce the deviation of the light-emitting devices (such as the light-emitting devices 151 or other similar light-emitting devices).

In the present embodiment, the second lower electrode 123 of the second electrode 120 may further include a second electrode extension region 324. During the process of manufacturing the light-emitting apparatus 300 (e.g., the step of disposing the light-emitting devices 150 on the circuit substrate 140), the second electrode extension region 324 may possibly reduce the deviation of the light-emitting devices (such as the light-emitting devices 151 or other similar light-emitting devices).

Based on the above, in the invention, the corresponding arrangement between the first electrode and the second electrode of the circuit substrate and the first conductive terminal and the second conductive terminal of the light-emitting device may make the repair of the light-emitting apparatus easier in the manufacturing process thereof, and may reduce possible damage to the devices during the manufacturing process. In this way, the light-emitting apparatus may have better quality.

What is claimed is:

1. A light-emitting apparatus, comprising:
a circuit substrate comprising a first electrode and a second electrode; and
a light-emitting device disposed on a first surface of the circuit substrate, wherein the light-emitting device comprises a first conductive terminal and a second conductive terminal, the first conductive terminal and the second conductive terminal are embedded between the first electrode and the second electrode, wherein in a first direction, there is a first distance between an inner edge of the first electrode and an inner edge of the second electrode, there is a second distance between an outer edge of the first conductive terminal and an outer edge of the second conductive terminal, and the first distance is greater than or equal to the second distance, wherein the first electrode comprises a first upper electrode, the second electrode comprises a second upper electrode, and a melting point of the first upper electrode and a melting point of the second upper electrode are less than a melting point of the first conductive terminal and a melting point of the second conductive terminal.

2. The light-emitting apparatus of claim 1, wherein a ratio of the first distance to the second distance is between 1.0 and 1.1.

3. The light-emitting apparatus of claim 1, wherein the melting point of the first upper electrode or the melting point of the second upper electrode is less than 500° C.

4. The light-emitting apparatus of claim 1, wherein:
there is a first spacing between the outer edge of the first conductive terminal and the inner edge of the first electrode, and the first upper electrode is filled in the first spacing; or
there is a second spacing between the outer edge of the second conductive terminal and the inner edge of the second electrode, and the second upper electrode is filled in the second spacing.

5. The light-emitting apparatus of claim 1, wherein:
the outer edge of the first conductive terminal is in contact with the first upper electrode; or
the outer edge of the second conductive terminal is in contact with the second upper electrode.

6. The light-emitting apparatus of claim 1, wherein:
the first electrode further comprises a first lower electrode, wherein the first upper electrode is located on the first lower electrode and electrically connected to the first lower electrode, and a projected area of the first lower electrode on the first surface is larger than a projected area of the first upper electrode on the first surface; or
the second electrode further comprises a second lower electrode, wherein the second upper electrode is located on the second lower electrode and electrically connected to the second lower electrode, and a projected area of the second lower electrode on the second surface is larger than a projected area of the second upper electrode on the second surface.

7. The light-emitting apparatus of claim 1, wherein in a second direction perpendicular to the first surface, a portion of the first upper electrode or a portion of the second upper electrode is not overlapped with a light-emitting die.

8. The light-emitting apparatus of claim 1, wherein the first surface of the circuit substrate does not have an adhesive material.

9. The light-emitting apparatus of claim 1, wherein the light-emitting device further comprises a light-emitting die electrically connected to the first conductive terminal and the second conductive terminal, and a light-emitting surface of the light-emitting die faces away from the circuit substrate.

10. A manufacturing method of a light-emitting apparatus, comprising:
providing a circuit substrate having a plurality of electrode pairs, wherein each of the electrode pairs comprises a first electrode and a second electrode;
providing a light-emitting device comprising a first conductive terminal and a second conductive terminal;
disposing the light-emitting device on the circuit substrate so that the first conductive terminal and the second conductive terminal are embedded between the first electrode and the second electrode, wherein in a first direction, there is a first distance between an inner edge of the first electrode and an inner edge of the second electrode, there is a second distance between an outer edge of the first conductive terminal and an outer edge of the second conductive terminal, and the first distance is greater than or equal to the second distance, wherein the first electrode comprises a first upper electrode, the second electrode comprises a second upper electrode, and the manufacturing method of the light-emitting apparatus further comprises:
heating the first upper electrode so that the first upper electrode is electrically connected to the first conductive terminal; and
heating the second upper electrode so that the second upper electrode is electrically connected to the second conductive terminal.

11. The manufacturing method of the light-emitting apparatus of claim 10, wherein:
in the step of heating the first upper electrode, at least a portion of the first upper electrode is melted so that the first upper electrode is in contact with the first conductive terminal; and
in the step of heating the second upper electrode, at least a portion of the second upper electrode is melted so that the second upper electrode is in contact with the second conductive terminal.

12. The manufacturing method of the light-emitting apparatus of claim 10, wherein the step of heating the first upper electrode or the step of heating the second upper electrode comprises heating by a laser.

13. The manufacturing method of the light-emitting apparatus of claim 10, further comprising:
providing an electronic device comprising a third conductive terminal and a fourth conductive terminal;
disposing the electronic device on the circuit substrate so that the third conductive terminal and the fourth conductive terminal are embedded between the first electrode and the second electrode, wherein in the first direction, there is a third distance between an outer edge of the third conductive terminal and an outer edge of the fourth conductive terminal, and the first distance is greater than or equal to the third distance;
removing the electronic device disposed on the circuit substrate; and
disposing the light-emitting device on the circuit substrate after the electronic device disposed on the circuit substrate is removed.

14. A manufacturing method of a light-emitting apparatus, comprising:
providing a circuit substrate having a plurality of electrode pairs, wherein each of the electrode pairs comprises a first electrode and a second electrode;
providing an electronic device comprising a third conductive terminal and a fourth conductive terminal;
disposing the electronic device on the circuit substrate so that the third conductive terminal and the fourth conductive terminal are embedded between the first electrode and the second electrode, wherein in a first direction, there is a first distance between an inner edge of the first electrode and an inner edge of the second electrode, there is a third distance between an outer edge of the third conductive terminal and an outer edge of the fourth conductive terminal, and the first distance is greater than or equal to the third distance;
removing the electronic device disposed on the circuit substrate;
providing a light-emitting device comprising a first conductive terminal and a second conductive terminal; and
disposing the light-emitting device on the circuit substrate after the electronic device disposed on the circuit substrate is removed so that the first conductive terminal and the second conductive terminal are embedded between the first electrode and the second electrode, wherein in the first direction, there is a second distance between an outer edge of the first conductive terminal and an outer edge of the second conductive terminal, and the first distance is greater than or equal to the second distance.

15. The manufacturing method of the light-emitting apparatus of claim 14, wherein the first electrode comprises a first upper electrode, the second electrode comprises a second upper electrode, and the manufacturing method of the light-emitting apparatus further comprises:
   heating the first upper electrode so that the first upper electrode is electrically connected to the first conductive terminal; and
   heating the second upper electrode so that the second upper electrode is electrically connected to the second conductive terminal.

16. The manufacturing method of the light-emitting apparatus of claim 15, wherein:
   in the step of heating the first upper electrode, at least a portion of the first upper electrode is melted so that the first upper electrode is in contact with the first conductive terminal; and
   in the step of heating the second upper electrode, at least a portion of the second upper electrode is melted so that the second upper electrode is in contact with the second conductive terminal.

17. The manufacturing method of the light-emitting apparatus of claim 15, wherein the step of heating the first upper electrode or the step of heating the second upper electrode comprises heating by a laser.

\* \* \* \* \*